(12) United States Patent
Chow et al.

(10) Patent No.: US 6,501,185 B1
(45) Date of Patent: Dec. 31, 2002

(54) BARRIER CAP FOR UNDER BUMP METAL

(75) Inventors: Yeung Ming Chow, Tsuen Wan (HK); Zaheed Sadrudin Karim, New Territories (HK)

(73) Assignee: Advanced Interconnect Technology Ltd., Tsuen Wan (HK)

(*) Notice: Subject to any disclaimer, the term of this patent is extended or adjusted under 35 U.S.C. 154(b) by 0 days.

(21) Appl. No.: 10/154,931

(22) Filed: May 28, 2002

Related U.S. Application Data

(63) Continuation of application No. 09/878,271, filed on Jun. 12, 2001, now Pat. No. 6,413,851.

(51) Int. Cl.[7] .......................... H01L 23/48; H01L 23/52
(52) U.S. Cl. ................................. 257/780; 257/781
(58) Field of Search ................................. 257/780, 781; 438/613, 614

(56) References Cited

U.S. PATENT DOCUMENTS

| | | | | |
|---|---|---|---|---|
| 5,894,410 A | * | 4/1999 | Barrow | 361/760 |
| 5,990,547 A | * | 11/1999 | Sharma et al. | 257/700 |
| 6,169,329 B1 | * | 1/2001 | Farnworth et al. | 257/780 |
| 6,175,160 B1 | * | 1/2001 | Paniccia et al. | 257/778 |
| 6,413,851 B1 | * | 7/2002 | Chow et al. | 438/613 |

* cited by examiner

*Primary Examiner*—Alexander Ghyka
(74) *Attorney, Agent, or Firm*—Dorsey & Whitney LLP

(57) ABSTRACT

A semiconductor wafer having solder bumps thereon for use in flip-chip bonded integrated circuits comprises a semiconductor substrate formed with metal bond pads at selected locations thereon, a metal electroplating buss layer or layers over the bond pads, a layer of solder-wettable under bump metal on the buss layer, a layer of barrier metal which overlies and encapsulates the solder-wettable metal, and a solder bump formed on the barrier metal.

18 Claims, 2 Drawing Sheets

BARRIER CAP FOR UNDER BUMP METAL

This application is a continuation of U.S. patent application Ser. No. 09/878,271, filed on Jun. 12, 2001, now U.S. Pat. No. 6,413,851.

BACKGROUND OF THE INVENTION

The present invention relates to a wafer provided with solder bumps for use in flip-chip bonded integrated circuits where a metallic "cap" over the under bump metal is used as a barrier layer.

In the manufacture of integrated circuits it is known to attach a semiconductor chip to a substrate through a plurality of solder bump interconnections which are first formed on the integrated circuit and which is subsequently assembled face down on the substrate. As well as providing electrical contacts the solder bumps form mechanical and thermal connection between the chip and substrate. Solder compositions are usually based on tin alloys, and the most common is lead-tin.

The solder bumps are usually applied onto a series of intermediate metallic layers. More particularly, the semiconductor wafer includes metallic pads typically of aluminium over which are applied thin intermediate chromium and copper layers, and onto which is applied by electroplating a relatively thick layer of copper as an under bump metal (UBM) layer. The solder is applied onto this Cu UBM layer. Electroplated Cu UBM layers with thickness between 5 and 8 microns are commonly employed in the fabrication of lead-tin solder bumps for flip-chip applications. The Cu UBM provides a foundation for the solder to adhere to upon reflow and serves the function of a barrier layer between the solder and the bond pad of the IC to prevent in-diffusion of the solder into the semiconductor chip.

However, at the melting point temperature for the lead-tin solder there typically forms a tin-copper intermetallic compound which, although necessary for a reliable mechanical joint, is also brittle and prone to fracture particularly when the layer is too thick. It is therefore desirable to limit the thickness of the intermetallic layer, which can grow to become significant after multiple reflow cycles or if the bump is kept near the melting point of solder for an extended period of time. The rapid formation of the intermetallic layer is due mainly to the property of the dissolution rate of copper into tin which, in the case of eutectic lead-tin solder, constitutes 63% (by weight) of the alloy. This problem is not as important for the case of high-lead bumps with compositions of 3% or 5% tin, but becomes more severe with increased tin content. A variety of materials have been considered for use as barrier materials.

Nickel is particularly attractive for use as a barrier to the formation of a thick tin-copper ($Sn_6Cu_5$) intermetallic layer since it dissolves a factor of 25 times slower than copper (at the normal eutectic solder reflow temperature of 250° C.). Palladium is also attractive, although less so because of its high cost.

The use of such a barrier metal is disclosed in U.S. Pat. No. 5,937,320 assigned to International Business Machines Corp, where a barrier layer comprising nickel is applied by electroplating to the UBM, here referred to as ball-limiting metallurgy. The method involves over-etching the Cu UBM beneath a thin nickel layer so as to prevent contact between the solder and exposed sides of the Cu UBM which if left in contact with the solder would cause the Cu to leach and form a thick intermetallic Sn—Cu layer. Although this barrier layer is effective in reducing dissolution of the Cu in the solder, the disclosed fabrication technique and resultant structure suffers problems of reliability, particularly at the edge regions of the barrier, where the Cu is still able to form intermetallics.

The present invention is directed to an improved technique for forming such a barrier layer.

SUMMARY OF THE INVENTION

According to a first aspect the invention resides in a wafer having solder bumps thereon comprising a semiconductor substrate formed with metal bond pads at selected locations thereon, a metal electroplating buss layer or layers over the bond pads, a layer of solder-wettable metal on the buss layer, a layer of barrier metal which overlies and encapsulates the solder-wettable metal, and a solder bump formed on said barrier metal.

The barrier metal is preferably nickel, but may also be palladium.

The barrier metal layer may be of thickness between 0.5 and 10 microns, more preferably 1 to 3 microns.

A method of fabrication of solder bumps on a semiconductor wafer provided with metal bond pads comprises the steps of: (a) applying a metal plating buss layer over at least the bond pads; (b) forming a layer of a resist in a predefined pattern defining openings therein over said bond pads; (c) applying a layer of solder-wettable metal into said openings over the metal plating buss layer; (d) removing a volume of resist from the regions of the openings to create an opening between an edge of the layer of wettable metal and the resist; (e) applying a layer of a barrier metal over the layer of solder-wettable metal including said openings created at step (d) which encapsulates the layer of wettable metal; (f) fabricating a solder bump onto the layer of barrier metal; (g) removing the resist material; and (i) removing any exposed metal plating buss layer.

This technique allows a barrier metal cap to be readily formed, and without additional intermediate masking steps being required.

In a preferred technique the resist is removed by plasma etching, such as oxygen plasma etching. Other etching techniques such as ion beam or a reactive ion etch can be utilised.

In another preferred technique the resist is removed by chemical means. Where the resist is a photoresist as is commonly employed the chemical means may be the developer with an over-development of the existing resist employed to create the desired clearance.

The layer solder wettable under bump metal is preferably copper, and the metal plating buss layer preferably of chromium or copper-chromium alloy which enhances the adhesion and reliability of the under bump metal. This under bump metal is preferably of thickness from 1 to 10 microns, more preferably from 5 to 6 microns.

In a further aspect a method of fabrication of solder bump interconnections on a semiconductor wafer provided with metal bond pads thereon at positions where electrical connection is to be made and a passivation layer having openings over the bond pads, comprises the steps of: (a) applying a layer or layers of a metal selected from the group comprising Cr, Cr:Cu alloy, Ti, Ti:W alloy, Ni:V alloy, Cu, Ni and Au or alloys thereof; (b) applying a layer of photoresist, exposing in a desired pattern and developing to remove photoresist; from regions to leave openings in the desired pattern above said bond pads; (c) applying a layer of copper within said openings; (d) removing additional resist from at least the periphery of the openings by employing an oxygen plasma etch to create a clearance between edges of the copper layer and the remaining photoresist; (e) applying a nickel layer to form a cap over the copper layer including the sides of the layer; (f) fabricating a solder bump on the nickel layer; (g) removing the photoresist; (h) removing the layer or layers applied at step (a) from the wafer, aside from where these underlie the solder bumps; and (i) heating the wafer to cause reflow of the solder bumps.

In a still further aspect a method of fabrication of solder bump interconnections on a semiconductor wafer provided with metal bond pads thereon at positions where electrical connection is to be made and a passivation layer having openings over the bond pads, comprises the steps of: (a) applying a layer or layers of a metal selected from the group comprising Cr, Cr:Cu alloy, Ti, Ti:W alloy, Ni:V alloy, Cu, Ni and Au or alloys thereof; (b) applying a layer of photoresist, exposing in a desired pattern and developing to remove photoresist from regions to leave openings in the desired pattern above said bond pads; (c) applying a layer of copper within said openings; (d) removing additional resist from at least the periphery of the openings by further developing the exposed photoresist to create a clearance between the edges of the copper layer and the remaining photoresist; (e) applying a nickel layer to form a cap over the copper layer including the sides of the layer; (f) fabricating a solder bump on the nickel layer; (g) removing the photoresist; (h) removing the layer or layers applied at step (a) from the wafer, aside from where these underlie the solder bumps; and (i) heating the wafer to cause reflow of the solder bumps.

BRIEF DESCRIPTION OF THE DRAWINGS

Embodiments of the invention are now described, by way of example only, with reference to the following drawings in which.

DETAILED DESCRIPTION OF THE PREFERRED EMBODIMENTS

Figure 1:
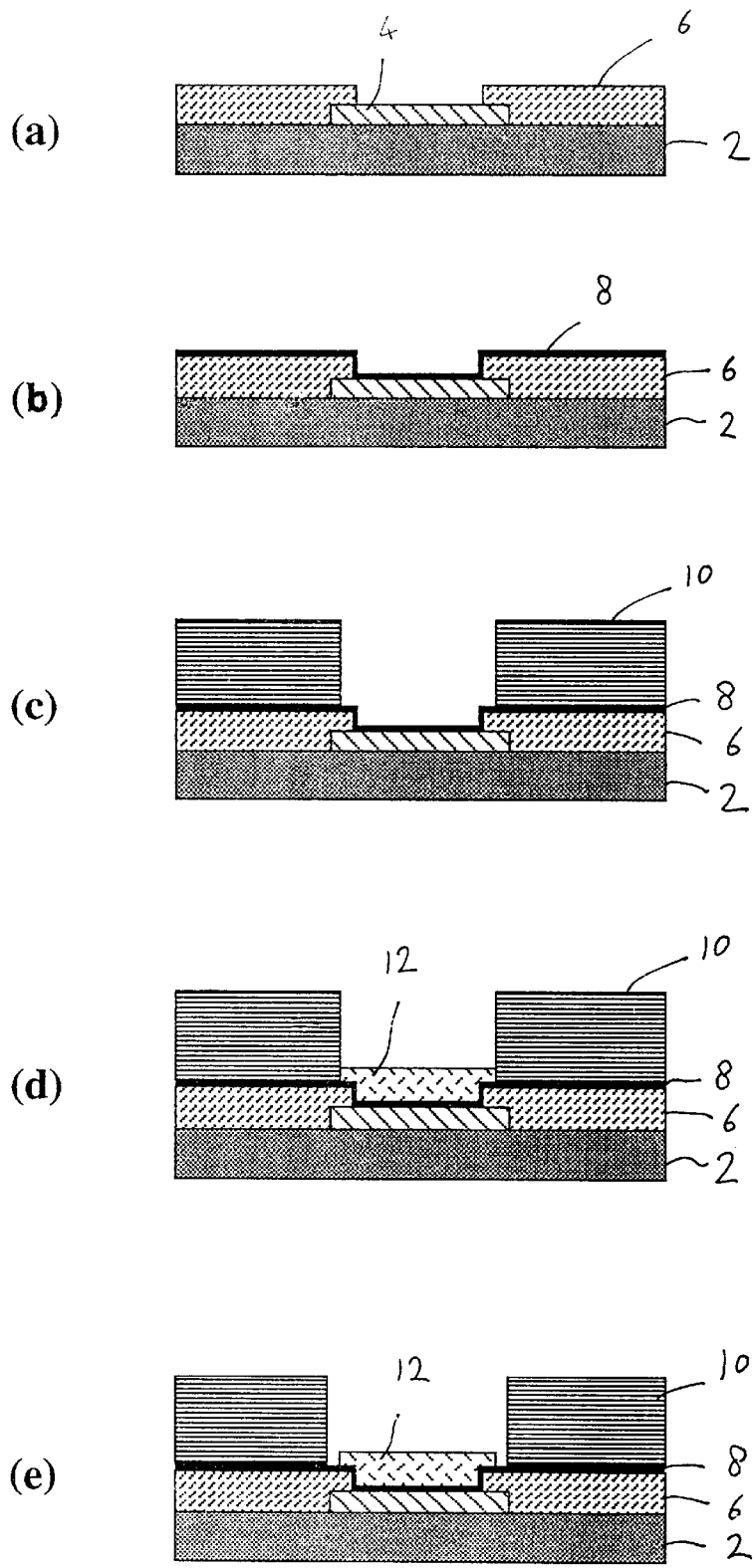
FIG. 1(a) is a cross-sectional view of part of a semiconductor wafer with bond pad and passivation layer formed thereon.
FIG. 1(b) shows the wafer of FIG. 1(a) with deposited Cr and Cu layers.
FIG. 1(c) shows a patterned photoresist applied.
FIG. 1(d) shows an electroplated under bump metal applied.
FIG. 1(e) shows the creation of an edge opening in the photoresist.
FIG. 1(f) shows the plating of a barrier metal.
FIG. 1(g) shows the solder applied.
FIG. 1(h) shows the removal of photoresist.
FIG. 1(i) shows the removal of Cr and Cu layers.
FIG. 1(j) shows the reflowed solder bump.
Figure 1:
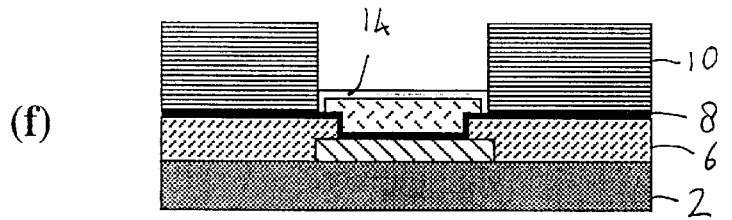
Figure 1:
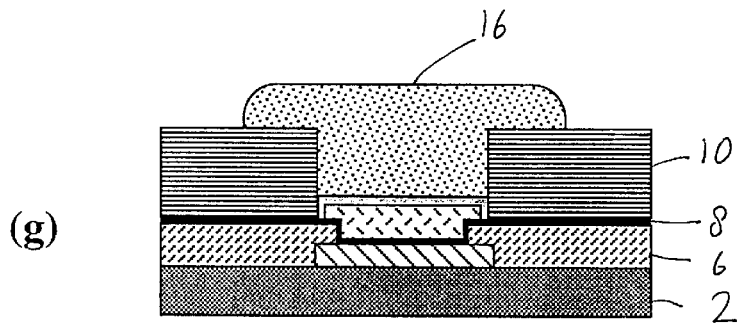
Figure 1:
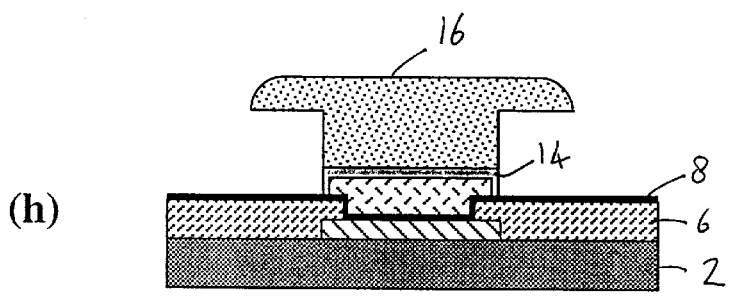
Figure 1:
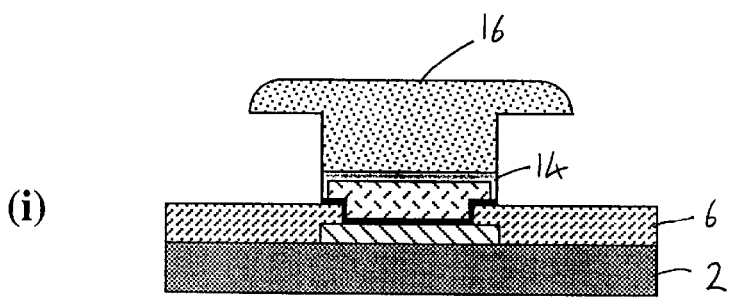
Figure 1:
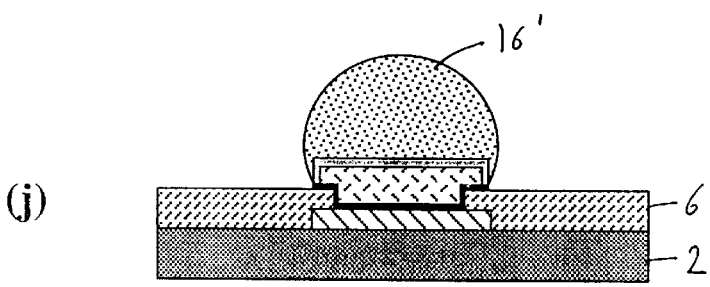

The fabrication of a solder bump which incorporates a barrier layer over the under bump metal is described with reference to the FIGS. 1(a) to (j) of the drawings.

FIG. 1(a) shows a semiconductor wafer 2 which is typically silicon, but may also be other conventional semiconductor materials as well understood in the art. Onto this is applied a metallic bond pad 4 of aluminium (Al) through which electrical contact is made to the active areas of the wafer 2. Although Al is the most common material other metals may be employed as the bond pad, such as Al doped with Si or Cu, or pure Cu, or a variety of other materials as well known in the art. A passivating layer 6 is formed over the wafer 2 leaving exposed areas over the bond pads 4.

Before subsequent processing, the coated wafer 2 is cleaned by a back-sputter process performed under vacuum to remove the naturally formed oxide layer on the bond pads 4. As indicated in FIG. 1(b), an adhesion/barrier/electroplating buss layer or layers, indicated 8, is/are applied by sputter deposition. The layer 8 may comprise one or more of Cr, Cr/Cu alloy, Ti, Ti/W, Ni/V, Cu, Ni and Au. A preferred structure has a first layer of Cr overlain by a second layer 8 Cu. The first layer performs a number of functions including increasing adhesion of subsequent layers to the bond pads, preventing re-oxidation of the bond pads and forming a barrier diffusion layer to the solder. The second Cu layer (which is optional) forms a seed layer for the under bump metal and also provides a wettable contact plating (electrical buss) layer.

FIG. 1(c) shows a thick layer 10 of a photoresist which is patterned onto the wafer by spin coating, either by a single spin or multiple spin of liquid resist to provide a thickness of between 50–100 microns. Alternatively, a dry film may be laminated directly thereon to a thickness of 100–150 microns. This photoresist layer is patterned by selectively exposing it to ultra violet light through a photomask having openings arranged therein at the appropriate locations to define the areas to be bumped, and developing the exposed photoresist to create the desired patterned of photoresist.

Typical parameters for forming the thick photoresist comprise an initial wafer clean followed by dehydration bake at 120° C. for 30 minutes. The wafer is then cooled to room temperature and left for 20 minutes. A first photoresist layer of Clariant AZ 4903 is applied by spin coating at 800 RPM for 30 seconds followed by leaving at room temperature for 20 minutes. A first pre-bake is carried out at 110° C. for 3.5 minutes on a hot-plate, the wafer cooled to room temperature and left for 20 minutes. A second coating of Clariant AZ 4903 is applied by spin coating at 800 RPM for 30 seconds, followed by leaving at room temperature for 20 minutes. A second pre-bake is carried out at 110° C. for 6.5 minutes on a hot-plate. The hot wafer is cooled to room temperature and left for 30 minutes. The coated wafer is then exposed to UV light at 15 MW/cm$^2$ for 120 seconds. The exposed photoresist is developed using AZ 400K developer in which the wafer is immersed and gently agitated in 1:4 dilution with de-ionised water for 2.5 minutes followed by 1:2 dilution with de-ionised water for 1 minute. The developed wafer is hardbaked at 80° C. for 10 minutes on a hot-plate. A final descum in oxygen plasma at 50° C. for 0.7 minutes is effected.

To the patterned wafer there is then applied, preferably by electroplating, a layer 12 of Cu which forms a wettable foundation to the solder bump, referred to as the under bump metal (UBM).

This layer is of about 1–10 microns thickness, typically 5–6 microns. Typical plating parameters include a fountain plating technique employing a plating solution such as Cupronal BP of Shipley Ronal, with a copper:phosphorus anode, plating bath temperature of 25° C., current density 7 ASD (amps per square decimetre) and plating time of 10 minutes. It will be appreciated that a variety of other plating techniques, parameters and solutions can be employed, as the skilled person will understand.

Alternatively, the layer 12 may be nickel, but this is less preferred as a pure nickel UBM can generate severe stress build-up and is extremely hard.

Instead of the bumping techniques following the application of the UBM 12 as is conventional, the coated wafer is subjected to a procedure in order to remove an edge region of the photoresist 10 where this abuts the UBM 12 in order to allow the subsequent deposition of a barrier cap 14 which encapsulates the UBM. A number of techniques are found to be particularly effective at appropriately removing the UBM 12 in particular a plasma etch, and an overdeveloping process.

A plasma etch process employs a gaseous plasma preferably of oxygen which strips the photoresist across its exposed surfaces, thereby removing both thickness and lateral extent in the openings, and creating a clearance between the edge of the UBM 12 and the photoresist sidewall. Prior to the etch a mild pre-baking at 110° C. for about 1 minute is carried out. A plasma etch at 50° C. for 3.5 min, oxygen flow rate of 500 CCM (cubic centimetres a minute), RF power of 400 W at 13.56 kHz is found to be sufficient to create an appropriate edge opening of about 1 micron. It is found the plasma etch does not erode the photoresist sidewall uniformly but produces a slightly concave profile.

In the overdeveloping process, the coated wafer is subjected to deliberate photoresist over-development. In the original development of the exposed photoresist prior to the UBM layer plating discussed above, the process parameters are selected to allow production of a sharply defined patterned resist of the desired dimensions. However, in the regions defining the openings the UV exposure of the photoresist does not have a precisely defined boundary between exposed and non-exposed regions, and there is a transitional region subjected to a degree of UV exposure which is susceptible to further development. The parameters of the over-development are selected to ensure that the photoresist is deliberately further eroded in the openings in order to form the desired gap between the UBM 12 and edge of the photoresist defining the opening. There is also however chemical erosion of the bulk photoresist away from the openings, so that the photoresist thickness in unexposed regions is reduced. A suitable developer type is Clariant AZ 400K or AZ 421K with an over-development time of about 5 minutes at room temperature. This typically yields a gap of about 3 microns between the UMB 12 and edge of the photoresist.

Other techniques for removal of the photoresist can be utilised such as ion beam and reactive ion etching, both of which effect removal of photoresist across the resist surface as well as at the openings. Reactive etch using as the reactive gas $CCl_4$ has been found to be effective at removing photoresist. Appropriate tilting and rotating of the sample in the tilted orientation facilitates the etch of the photoresist sidewall and the creation of the desired gap between UBM 12 and photoresist sidewall.

Such ion beam etching techniques are more completely described for example in the following references:
1. D. F. Downey, W. R. Bottoms, and P. R. Hanley, "Introduction to Reactive Ion Beam Etching", Solid State Technology, February 1981, pp. 121–127.
2. L. D. Bollinger, "Ion Beam Etching with Reactive Gases", Solid State Technology, January 1983, pp. 65–72.
3. J. D. Chinn, I. Adeisa, and E. D. Wolf, "Profile Formation in CAIBE", Solid State Technology, May 1984, pp. 123–130.
4. L. D. Bollinger, S. Lida, and O. Matsumoto, "Reactive Ion Etching: Its Basis and Future", Solid State Technology, May 1984, pp. 111–117.
5. J. P. Ducommun, M. Cantagrel, and M. Moulin, "Evolution of Well-Defined Surface Contour Submitted to Ion Bombardment: Computer Simulation and Experimental Investigation", Journal of Material Science, Volume 10, 1975, pp.52–62.

To the resultant coated wafer as illustrated in FIG. 1(e) with the clearance between the edge of the UBM 12 and photoresist there is applied the barrier metal layer 14 as illustrated in FIG. 1(f).

The preferred barrier material is nickel, deposited in a thickness of between 0.5 and 10 microns, more preferably 1–3 microns. This is most conveniently applied by electroplating. Typical process parameters comprise a plating solution such as Nikal PC-3 of Shipley Ronal, employing a fountain plating technique with rapid stirrer agitation, a nickel anode, bath temperature of 50° C., plating current density 2 ASD for 7 minutes. It will be appreciated however that such parameters may be varied as required to form a nickel layer of desired thickness. Alternatively, other plating technique may be utilised. As can be seen in FIG. 1(f) the nickel cap 14 encapsulates the UBM 12, including the edge regions of the UBM 12.

As noted above palladium can instead be used as the barrier metal cap. The plating of palladium requires the use of one of a number of possible proprietary palladium plating solutions.

The coated wafer with nickel (or palladium) capped UBM is then provided with the solder bump 16, as indicated in FIG. 1 (g). The solder bump 16 may comprise a variety of compositions. Lead tin alloys are the most commonly employed, in particular eutectic lead:tin, although, increasingly, other solder compositions are utilised. Compositions such as the lead-free solders described in the Applicant's co-pending Patent Application U.S. Ser. No. 09/552,560 may be employed including pure tin, tin-copper alloys, tin-silver alloys, tin-bismuth alloys and tin-silver-copper alloys, all of which include a substantial proportion of tin. The solder bump 16 may be applied by a variety of techniques such as screen printing or solder ball placement, but electroplating is the most common technique. The electroplating of eutectic lead:tin is well documented. The electroplating of the lead free solders recited in Applicant's U.S. Ser. No. 09/552,560 is described therein, the contents of which are incorporated by reference. As will be seen, the solder bump 16 is applied only to the nickel or palladium cap 14 which thereby forms a barrier between UBM 12 and solder bump 16.

Following the plating of the bumps, FIG. 1(h) shows the photoresist 10 removed. This is achieved using a chemical technique employing a liquid stripper as well known in the art. This is followed by removal from the wafer face of the exposed sputtered adhesion/barrier/electrical buss layer or layers 8 by a chemical or electrochemical back-etching technique, as is also well known.

This is followed by the optional application of a flux to the as-plated bumps 16, and by reflow of the solder bumps by heating in an oven to a temperature above the solder melting point leading to adoption of the spherical shape as indicated in FIG. 1(j) which is retained on solidification in the re-flowed solder bump 16'. As can be seen in the FIG., reflow occurs over the sides of the nickel cap 14 but the solder bump remains separated from the UBM 12 by means of the cap 14.

Analyses of the reflowed solder bumps 16 produced according the above-described techniques by SEM, Auger and EDX scans show that a nickel cap 14 significantly limits the otherwise rapid and uneven formation of tin-copper intermetallics, and shows sharp divisions of constituents with the copper effectively constrained beneath the nickel cap 14, and the tin confined to the solder bump above the nickel cap 14.

What is claimed is:

1. A wafer having solder bumps thereon comprising a semiconductor substrate formed with metal bond pads at selected locations thereon, a metal electroplating buss layer or layers over the bond pads, a layer of solder-wettable metal on the buss layer, a layer of barrier metal which overlies and encapsulates the solder-wettable metal, and a solder bump formed on said barrier metal.

2. A wafer according to claim 1 wherein the barrier metal is nickel.

3. A wafer according to claim 1 wherein the barrier metal layer is of between 0.5 and 10 microns in thickness.

4. A wafer according to claim 3 wherein the barrier metal layer is of between 1 and 3 microns in thickness.

5. A wafer according to claim 1 wherein the barrier metal is palladium.

6. A wafer according to claim 1 wherein the metal electroplating buss layers comprise a layer or layers of metal selected from the group comprising Cr, Cr:Cu alloy, Ti, Ti:W alloy, Ni:V alloy, Cu, Ni and Au.

7. A wafer according to claim 6 wherein the metal electroplating buss layers comprise a first layer of Cr and a second layer of Cu.

8. A wafer according to claim 1 wherein the layer of solder-wettable metal is of Cu.

9. A wafer according to claim 8 wherein the solder-wettable Cu layer is of thickness from 5 to 6 microns.

10. A wafer having solder bumps thereon comprises a semiconductor substrate formed with metal bond pads at selected locations thereon, a metal electroplating buss layer or layers over the bond pads, a layer of solder-wettable metal on the buss layer, a barrier layer of a metal which overlies the layer of solder-wettable metal and extends over edge regions thereof to encapsulate the layer of solder-wettable metal, and a solder bump deposited on said barrier metal.

11. A wafer according to claim 10 wherein the barrier metal is nickel.

12. A wafer according to claim 10 wherein the barrier metal layer is of between 0.5 and 10 microns in thickness.

13. A wafer according to claim 12 wherein the barrier metal layer is of between 1 and 3 microns in thickness.

14. A wafer according to claim 10 wherein the barrier metal layer is palladium.

15. A wafer having solder bumps, fabricated by a method comprising the steps of:
   (a) applying a metal plating buss layer over a semiconductor substrate formed with metal bond pads;
   (b) forming a layer of a photoresist in a predefined pattern defining openings therein over said bond pads;
   (c) applying a layer of solder-wettable metal under bump metal into said openings over said plating buss layer;
   (d) removing a volume of photoresist from regions of said openings to create an opening between an edge of the layer of said wettable metal and said photoresist;
   (e) applying a layer of a barrier metal over said layer of solder-wettable metal including the openings created in step (d) which encapsulates said layer of wettable metal;
   (f) fabricating a solder bump onto said layer of barrier metal;
   (g) removing said photoresist; and
   (h) removing any exposed plating buss layer.

16. A wafer having solder bump interconnections on metal bond pads at positions where electrical connection is to be made and a passivation layer having openings over the bond pads, said wafer is fabricated by a method comprising the steps of:
   (a) applying a layer or layers of a metal selected from the group comprising Cr, Cr:Cu alloy, Ti, Ti:W alloy, Ni:V alloy, Cu, Ni and Au or alloys thereof to a semiconductor substrate formed with metal bond pads;
   (b) applying a layer of photoresist, exposing in a desired pattern and developing to remove photoresist from regions to leave openings in the desired pattern above said bond pads;
   (c) applying a layer of copper within said openings;
   (d) removing additional photoresist from at least the periphery of the openings to create a clearance between edges of the copper layer and the remaining photoresist;
   (e) applying a nickel layer to form a cap over the copper layer including the sides of the layer;
   (f) fabricating a solder bump on the nickel layer;
   (g) removing the photoresist;
   (h) removing the layer or layers applied at step (a) from the wafer, aside from where these underlie the solder bumps; and
   (i) heating the wafer to cause reflow of the solder bump.

17. The wafer of claim 16, wherein the additional photoresist from at least the periphery of the openings is removed by employing an oxygen plasma etch.

18. The wafer of claim 16, wherein the additional photoresist from at least the periphery of the openings is removed by further developing the exposed photoresist.

* * * * *